(12) United States Patent
Caimi et al.

(10) Patent No.: US 9,105,842 B2
(45) Date of Patent: Aug. 11, 2015

(54) METHOD FOR MANUFACTURING A CARBON-BASED MEMORY ELEMENT AND MEMORY ELEMENT

(75) Inventors: Daniele Caimi, Rueschlikon (CH); Evangelos S. Eleftheriou, Rueschlikon (CH); Charalampos Pozidis, Rueschlikon (CH); Christophe P. Rossel, Rueschlikon (CH); Abu Sebastian, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 13/807,422

(22) PCT Filed: Jun. 24, 2011

(86) PCT No.: PCT/IB2011/052790
§ 371 (c)(1),
(2), (4) Date: Jan. 30, 2013

(87) PCT Pub. No.: WO2012/001599
PCT Pub. Date: Jan. 5, 2012

(65) Prior Publication Data
US 2013/0214239 A1    Aug. 22, 2013

(30) Foreign Application Priority Data

Jun. 30, 2010  (EP) .................................. 10167998
Jun. 30, 2010  (EP) .................................. 10168020

(51) Int. Cl.
*H01L 21/20*    (2006.01)
*H01L 45/00*    (2006.01)
*G11C 13/00*    (2006.01)

(52) U.S. Cl.
CPC ............... *H01L 45/16* (2013.01); *H01L 45/04* (2013.01); *H01L 45/1253* (2013.01); *H01L 45/149* (2013.01); *G11C 13/0002* (2013.01); *G11C 2213/15* (2013.01); *G11C 2213/35* (2013.01)

(58) Field of Classification Search
CPC ............................ H01L 45/16; H01L 45/1253
USPC ................................................ 257/4; 438/382
See application file for complete search history.

(56) References Cited

U.S. PATENT DOCUMENTS 7,768,016 B2    8/2010    Kreupl
8,754,392 B2    6/2014    Caimi et al.
(Continued)

FOREIGN PATENT DOCUMENTS

JP    2010141046 A    6/2010
WO    2010017427 A1    2/2010
WO    2011106155 A2    9/2011

OTHER PUBLICATIONS

E.G. Gerstner, "Bistability in a-C for memory and antifuse applications," In Silva,Properties of Amorphous Carbon, IEEE Inspec, London, 2003, Only pp. 318-232, Section C.
(Continued)

*Primary Examiner* — Matthew Landau
*Assistant Examiner* — Igwe U Anya
(74) *Attorney, Agent, or Firm* — Cantor Colburn LLP

(57) ABSTRACT

A method for manufacturing a resistive memory element includes providing a storage layer comprising a resistance changeable material, said resistance changeable material comprising carbon; providing contact layers for contacting the storage layer, wherein the storage layer is disposed between a bottom contact layer and a top contact layer; and doping the resistance changeable material with a dopant material.

4 Claims, 10 Drawing Sheets

(56) References Cited

U.S. PATENT DOCUMENTS

| | | |
|---|---|---|
| 2009/0230379 A1* | 9/2009 | Klostermann et al. ............ 257/5 |
| 2009/0258489 A1 | 10/2009 | Chen et al. |
| 2009/0283735 A1 | 11/2009 | Li et al. |
| 2010/0012914 A1 | 1/2010 | Xu et al. |
| 2010/0032643 A1* | 2/2010 | Xu ................................. 257/4 |
| 2010/0081268 A1 | 4/2010 | Schricker et al. |
| 2010/0163824 A1 | 7/2010 | Xu et al. |
| 2010/0181546 A1* | 7/2010 | Yamamoto et al. ............... 257/2 |
| 2010/0245029 A1 | 9/2010 | Schricker et al. |
| 2010/0327253 A1* | 12/2010 | Nakai et al. ...................... 257/4 |
| 2011/0043518 A1* | 2/2011 | Von Borries et al. ......... 345/419 |
| 2011/0076826 A1* | 3/2011 | Cheng et al. .................. 438/382 |
| 2012/0001142 A1* | 1/2012 | Caimi et al. ...................... 257/2 |
| 2012/0043518 A1* | 2/2012 | Cheng et al. ...................... 257/4 |

OTHER PUBLICATIONS

International Search Report and Written Opion for International Application No. PCT/IB2011/052790; International filing Date: Jun. 24, 2011, Date of mailing: Jan. 31, 2012; 22 pages.

R. Silva, "Properties of Amorphous Carbon," The Institution of Engineering and Technology, 2003, Only pp. 318-332, Section C.

UK Intellectual Property Office, Application No. GB1301220.8, Patents Act 1977: Examination Report under Section 18(3), Date mailed: Jan. 12, 2015, pp. 1-3.

* cited by examiner

METHOD FOR MANUFACTURING A CARBON-BASED MEMORY ELEMENT AND MEMORY ELEMENT

PRIORITY

This is a U.S. national stage of application No. PCT/IB2011/052790, filed on 24 Jun. 2011. Priority under 35 U.S.C. §119(a) and 35 U.S.C. §365(b) is claimed from European Patent Application No. 10167998.3, filed 30 Jun. 2010, and European Patent Application No. 10168020.5, filed 30 Jun. 2010, and all the benefits accruing therefrom under 35 U.S.C. §119, the contents of which in their entirety are herein incorporated by reference.

BACKGROUND

This disclosure relates to methods for manufacturing memory devices, as for example carbon-based resistive memory devices including non-volatile memory cells. Also carbon-based resistive memory elements, devices and integrated circuits are presented.

Memory devices are widely used in computing applications and in many electronic devices. For some applications, non-volatile memory which retains its stored data even when power is not present, may be used. For example, non-volatile memory is typically used in digital cameras, portable audio players, wireless communication devices, personal digital assistants, and peripheral devices, as well as for storing firmware in computers and other devices.

A variety of conventional memory technologies have been developed. For example, non-volatile memory technologies are flash memory, magneto-resistive random access memory (MRAM), and phase change memory (PCM). Due to the great demand for memory devices, researchers are continually improving memory technology and developing new types of memory, including new types of non-volatile memory and memory based on new materials. It is generally desirable to reduce the dimensions of the memory cells and reduce the complexity of peripheral circuitry used to operate the memory.

To increase the efficiencies of electronic devices their size is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information. One such technology is resistivity changing memory, which stores information based on changes in the resistivity of a memory element. Depending on the resistivity changing memory technology being used, the resistivity of the storage layer is typically switched between a low resistivity state and a high resistivity state through the application of voltage or current across the storage layer.

One conventional type of resistivity changing memory or resistive memory is known as phase change memory (PCM). The resistivity changing memory elements used in PCM are phase changing memory elements that include a phase changing material. The phase changing material can be switched between at least two different crystallization states (i.e., the phase changing material may adopt at least two different degrees of crystallization), wherein each crystallization state may be used to represent a memory state. When the number of possible crystallization states is two, the crystallization state having a high degree of crystallization is also referred to as "crystalline state", whereas the crystallization state having a low degree of crystallization is also referred to as "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure).

Usually, the phase changing material forming the storage layer of a conventional PCM consist of a chalcogenide compound material, such as GeSbTe (GST), SbTe, GeTe or AgInSbTe. Programming the PCM is mostly executed by a temperature change of the phase changing material. There are a variety of mechanisms to realize such a thermally induced phase change. Conventional PCM relies on specific materials that may pose difficulties in the manufacturing of memory cells.

SUMMARY

According to an embodiment of a first aspect of the invention a method for manufacturing a resistive memory element is presented comprising the steps of:
providing a storage layer comprising a resistance changeable material, wherein the resistance changeable material comprises carbon,
providing contact layers for contacting the storage layer, wherein the storage layer is disposed between a bottom contact layer and a top contact layer; and
doping the resistance changeable material with a dopant material.

According to embodiments of the invention by doping the resistance changeable material the programming voltage or programming power of the resistive element can be changed or the resistance window of the resistive memory element can be tuned according to the needs of the application. Embodiments of the invention allow for altering and adapting the programming characteristics of a resistive memory element according to the needs of its actual application or implementation. It has been found that through doping an atomic reordering in the carbon storage layer may occur due to a facilitated development of aromatic benzene rings in the carbon structure. The dopant atoms can either substitute carbon atoms in the electronic structure of a carbon-based memory or enhance $sp^2$-clustering thereby altering the current voltage characteristic of the element.

According to embodiments of the invention the doping material, for example, comprises a transition metal. According to embodiments of the invention titanium (Ti), vanadium (V), zirconium (Zr) or tungsten (W) are chosen as dopant material. The dopant material can also be hydrogen (H) and/or nitrogen (N). In certain embodiments elements of group I and/or Group V of the periodic table may be used as dopants.

In one embodiment of the method, the resistance changeable material is amorphous carbon. According to an embodiment of the invention the amorphous carbon has a given ratio of $sp^2$-hybridized carbon with respect to $sp^3$-hybridized carbon. The amount of $sp^3$-hybridized carbon can exceed the amount of $sp^2$-hybridized carbon in the storage layer.

If amorphous carbon is chosen as resistance changeable material the dopant material can be according to embodiments of the invention hydrogen or nitrogen for rearranging an atomic order of the resistance changeable material and/or for inducing the creation of additional $sp^2$-hybridized carbon in the resistance changeable material. Through doping amorphous carbon, the hybridization of carbon predominantly into the $sp^2$ variant can be achieved. According to embodiments of the invention the resistance changeable material should comprise a given ratio of $sp^3$-hybridized carbon with respect to $sp^2$-hybridized carbon. The ratio can be $sp^3/sp^2 > 1$. However, also other ratios such as be $sp^3/sp^2 > 0.5$, $sp^3/sp^2 > 1.5$, or $sp^3/sp^2 > 3$ can be contemplated as certain embodiments.

In a further embodiment, the method further comprises the steps of:
providing a substrate;
sputtering a conducting material onto the substrate as the bottom contact layer;
sputtering the resistance changeable material onto the bottom contact layer; and
sputtering a conducting material onto the substrate as the top contact layer.

The substrate may be for instance silicon. A potential conducting material is titanium nitride (TiN) or molybdenum (Mo).

In addition to or independently from doping according to a further embodiment of the invention one may provide for annealing the resistance changeable material at a predetermined temperature over a predetermined annealing time for rearranging an atomic order of the resistance changeable material.

Hence according to an embodiment of another aspect of the invention a method for manufacturing a resistive memory element is presented comprising the steps of:
providing a storage layer comprising a resistance changeable material, wherein the resistance changeable material comprises carbon,
providing contact layers for contacting the storage layer, wherein the storage layer is disposed between a bottom contact layer and a top contact layer; and
annealing the resistance changeable material at a predetermined temperature over a predetermined annealing time for rearranging an atomic order of the resistance changeable material.

According to embodiments the programming voltage or programming power of the resistive memory element can be changed by annealing the resistance changeable material. According to further embodiments of the invention the resistance window of the resistive memory element can be tuned by an annealing process. Embodiments of the invention allow for altering and adapting the programming characteristics of a resistive memory element according to the needs of its actual application or implementation. For example, if a typically low threshold switching voltage is present, according to embodiments of the invention the voltage window for read operations from the memory element can be increased by the proposed annealing step.

According to an embodiment of the invention the resistance changeable material is a material whose resistance can be changed electro-thermally by Joule heating in order to program the resistive memory element. When programming the resistive memory element, the voltage pulse exceeding the switching threshold voltage is applied thereby causing localized thermal annealing along the current path through the storage layer due to Joule heating. Voltage pulses for writing data into or programming the memory element have typically durations in the order of nanoseconds.

According to an embodiment of the method for manufacturing a resistive memory element, the step of annealing includes a heating process of the storage layer at temperatures less than 600° C. In another embodiment of the method, the annealing includes a heating process at a temperature less than 500° C. In another embodiment, the annealing takes place at temperatures below 400° C. In yet another embodiment of the method, the annealing includes a heating process at temperatures less than 200° C.

When using amorphous carbon, the step of annealing is preferably adapted to increase the average cluster size of $sp^2$-hybridized carbon in the resistance changeable material. Investigations of the applicant have shown that by annealing the average size of $sp^2$-hybridized carbon structures can be changed. For example, through annealing at relatively low temperatures, the current-voltage curve of the resistive memory element can be significantly altered. It is in particular possible to change the programming behavior/programming curve of a resistive memory element by annealing. The mechanism of this atomic reordering in the carbon storage layer may be due to a facilitated development of aromatic benzene rings in the carbon structure.

According to an embodiment of the invention the resistance changeable material comprises more $sp^3$-hybridized carbon than $sp^2$-hybridized carbon. For example, a ratio of $sp^3$-carbon and $sp^2$-carbon is more than 1. $sp^3$-rich carbon can also be called diamond-like carbon or tetrahedral carbon.

According to an embodiment of the invention the step of annealing may be adapted so as to exclude an increase of the fraction of $sp^3$-hybridized carbon in the resistance changeable material. While conventional annealing processes usually occur at very high temperatures leading to a conversion of $sp^3$ to $sp^2$, according to embodiments of the invention low annealing temperatures are proposed that generally exclude such a conversion into the lower resistivity providing $sp^2$-carbon variant.

In one embodiment of the method, the step of annealing may comprise applying a laser pulse locally onto the storage layer. One may irradiate an appropriate laser pulse thereby increasing the local temperature and triggering an annealing process for tailoring the write and read properties of the resistive memory element along the lines stated above. The laser pulse may be longer than a conventional laser pulse for programming the memory element.

According to a further embodiment of the invention the method for manufacturing further comprises
a measuring step for measuring one or more characteristics of the resistive memory element, in particular the programming voltage or the programming power of the memory element or the resistance window of the memory element,
performing the annealing step and/or the doping step if one ore more measured characteristics are out of a predefined tolerance range.

According to an embodiment of a further aspect of the invention a resistive memory element comprising a bottom contact layer, a top contact layer and a storage layer disposed between the bottom contact layer and the top contact layer is provided. The storage layer comprises a resistance changeable material that is doped with a dopant material. The resistance changeable material comprises carbon.

According to an embodiment of the invention the resistance changeable material is a material whose resistance can be changed electro-thermally by Joule heating in order to program the resistive memory element. When programming the resistive memory element, the voltage pulse exceeding the switching threshold voltage is applied thereby causing localized thermal annealing along the current path through the storage layer due to Joule heating. Voltage pulses for writing data into or programming the memory element have typically durations in the order of nanoseconds.

According to embodiments of the invention the annealing step may be performed for a predetermined annealing time that exceeds a typical time period of e.g. a voltage pulse for programming the carbon-based memory element. In one embodiment the predetermined annealing time is larger than one millisecond. In other embodiments the predetermined annealing time is larger than 10 milliseconds. Another embodiment stipulates an annealing time of at least 60 seconds. One may also contemplate of several minutes annealing time, if, for example, an entire wafer including a plurality of prefabricated memory elements, shall be processed.

The dopant material may reduce or change the programmable voltage or power or tune resistance window of the resistive memory element according to the needs of the application.

The resistance changeable material may comprise carbon. According to an embodiment of the invention the resistance changeable material is amorphous carbon. It may be an advantage that the mono-atomic nature of carbon allows scaling a respective resistive memory element to very small feature sizes. For example, the surface area of the storage layer may correspond to an area having a diameter of 20 nm to 30 nm. Further, carbon is a relatively ubiquitous material and highly resilient to a variety of external stimuli. Therefore, in particular, amorphous carbon is suitable for the resistance changeable material of the storage layer.

The dopant material is preferably hydrogen or nitrogen. In one embodiment of the resistive memory element, the doping percentage is less than 20%.

In embodiments of a memory element the storage layer has a thickness between 12 nm and 50 nm. One can also contemplate of storage layers having thicknesses of approximately 20 nm, 25 nm, 40 nm and/or 50 nm. The storage layer may have a thickness between 20 nm and 50 nm. In one preferable embodiment the storage layer has a thickness between 5 nm and 10 nm.

The memory element may have at least the bottom contact layer comprising a conductive electrode embedded in an insulating material. For example, a titanium nitride electrode can be embedded in silicon dioxide. The memory element can for example have a geometrical structure similar to conventional phase change memory mushroom cells.

The memory element can further comprise additional circuitry as for example a transistor for selecting the memory element, a diode for selecting the memory element, a sense amplifier, bit lines and/or word lines.

According to a further embodiment of the invention the resistive memory element can be in particular implemented in terms of an integrated circuit including a plurality of memory elements as disclosed above, wherein the memory elements are arranged as an array between crossings of word lines and bit lines. Each memory element may have an assigned selection device. The bit lines and word lines may be arranged essentially perpendicular to one another.

The additional circuitry can comprise a transistor for selecting the memory element, a diode for selecting the memory element, a sense amplifier, bit lines or word lines.

According to an embodiment of the invention the resistive memory elements are non-volatile memory elements or memory cells.

Preferably, the contact layers are adapted to record or measure a lateral current through the storage layer of the resistance changeable material.

When electronic devices are fabricated, usually wafer structures carrying a plurality of devices are employed. According to embodiments of the invention the annealing step is applied to an entire wafer by heating the entire wafer in order to tailor the programming characteristics and/or the resistance window of the memory elements of the wafer. One may refer to a bulk annealing process affecting the entire structure containing memory elements and other circuitry. According to an embodiment of the invention the annealing step is performed by arranging resistive memory elements, a wafer comprising resistive memory elements or integrated circuits comprising resistive memory elements in an oven at a predetermined temperature over a predetermined annealing time.

Certain embodiments of the presented method for manufacturing a resistive memory element and the resistive memory element may comprise individual or combined features, method steps or aspects as mentioned above or below with respect to exemplary embodiments.

BRIEF DESCRIPTION OF THE SEVERAL VIEWS OF THE DRAWINGS

In the following, exemplary embodiments of methods and devices relating to the manufacture of resistive memory elements are described with reference to the enclosed drawings.

Like or functionally like elements in the drawings have been allotted the same reference characters, if not otherwise indicated.

DETAILED DESCRIPTION

As used herein, "resistance changeable material" refers to a material suitable for use in a resistive memory element or resistive memory cell. It is understood that a resistance changeable material can be characterized by its electric transport properties, and a resistance change is equivalent to a change in resistivity, conductance, conductivity or the current-voltage (I-V) characteristic. A resistance change may occur as function of an external stimulus such as a program voltage pulse or the application of heat, for example by a laser pulse.

"Annealing" essentially refers to a heat treatment of the material thereby changing the atomic structure of the material. Annealing may be performed under a controlled atmosphere preserving the material to be annealed from undesired oxidation or other chemical processes.

The term "layer", in particular relating to a contact layer, is to be understood as region comprising a material. A layer shall not be construed as to relate to a flat or thin geometry. Rather, layer stands for a region or a section that may also have an essentially cube-like or block-like shape in this disclosure.

Figure 1:
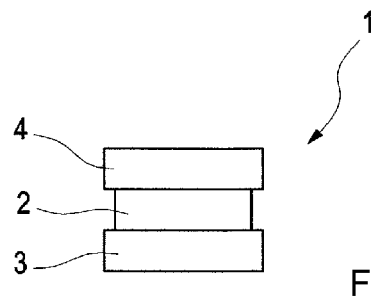
FIG. 1 shows a schematic diagram of a first embodiment of a resistive memory element.

Referring now to FIG. 1, which shows a schematic diagram of a resistive memory element, general properties of resistive memory elements manufactured by the methods according to embodiments of the invention are explained. The resistive memory element 1 comprises a bottom conductive layer 3 used as a first electrode, a storage layer 2 comprising resistance changeable material, as for example, amorphous carbon and a top contact layer 4. The storage layer 2 is sandwiched between the bottom contact layer 3 and the top contact layer 4 acting as electrodes. To use the resistive memory element in a memory cell, a selection device (not shown), such as a transistor, a diode, or another active device, may be coupled to the bottom electrode 3 or to the top electrode 4 to control the application of a current or a voltage to or through the storage layer 2. The storage layer 2 comprises a doped resistance changeable material suitable for resistive memory elements.

One embodiment of the resistivity changing memory element uses carbon, in particular amorphous carbon, as a resistivity changing material. Preferably, a variant of amorphous carbon that is rich in $sp^3$-hybridized carbon is used that has a relatively high resistivity. Generally, a variant of amorphous carbon that is rich in $sp^2$-hybridized carbon has a relatively low resistivity. This difference in resistivity can be used in a resistivity changing memory cell. Conventionally, a thermally induced conversion from $sp^3$ into $sp^2$-carbon and vice versa was used to program a resistive memory cell. However, investigations of the applicant have shown that by localized thermal annealing due to Joule heating, clusters of $sp^2$-carbon, e.g., in terms of coupled benzene rings, may be formed. This can lead to lower resistive filaments of $sp^2$-rich carbon along the current path of a programming voltage pulse applied through the storage layer 2.

The resistivity of the storage layer can be programmed, for example, by imposing a programming voltage pulse. The contact layers or electrodes 3, 4 are adapted to record a lateral current to the storage layer of the resistance changeable material employing measurements or circuitry which is not explicitly shown in FIG. 1. For example, a current may be driven through the storage layer 2 (or a voltage may be applied across the storage layer 2). To read out the memory, i.e., to determine the memory state of a resistivity changing memory element, a sensing current may be routed laterally through the material of the storage layer 2 (or a sensing voltage may be applied across the storage layer 2), thereby sensing the resistivity of the resistive memory element 1, which represents the memory state of the memory element. By tuning the I-V characteristics of the memory elements in terms of a switching threshold and resistivity window also a plurality of memory states corresponding to predetermined resistance values could be contemplated. This can be achieved by doping the storage layer material appropriately.

Figure 2:
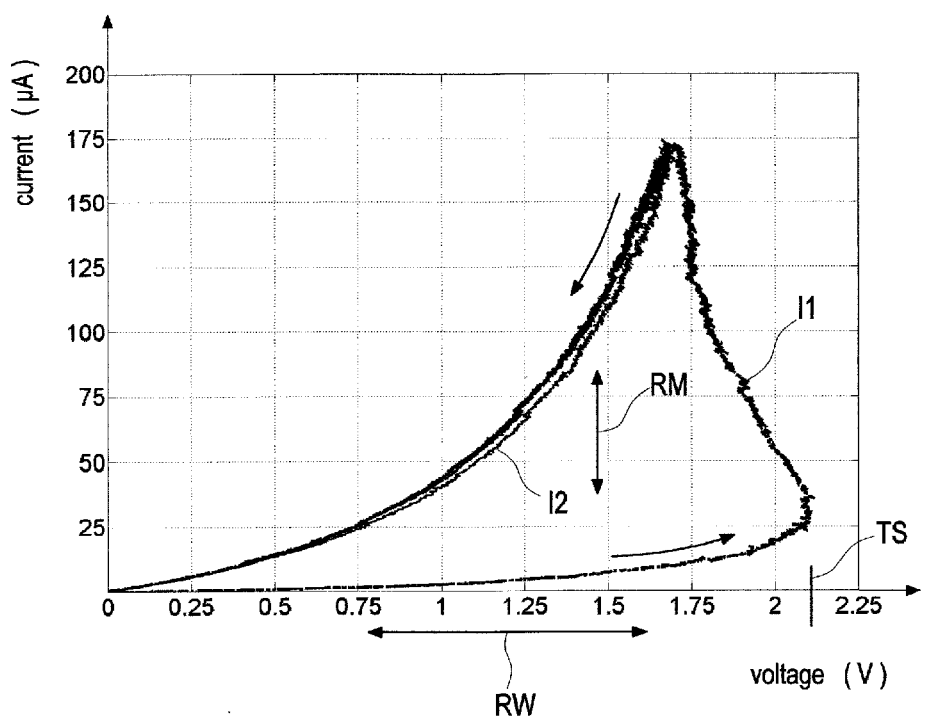
FIG. 2 shows an exemplary current-voltage characteristic of a resistive memory element.
Figure 2:
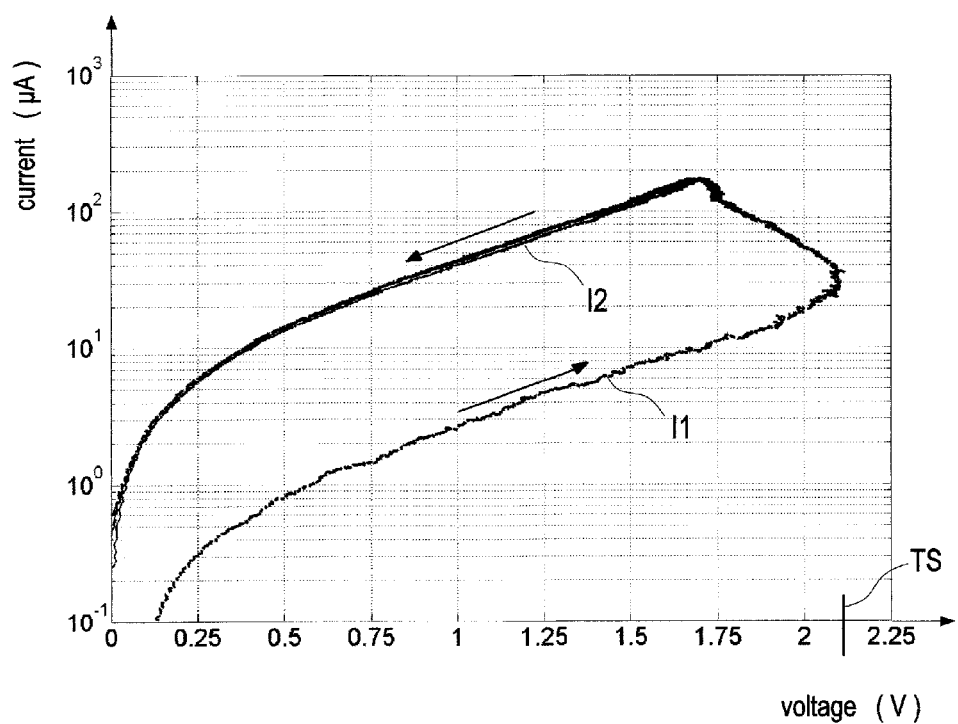

FIG. 2 shows an exemplary current voltage characteristic (I-V) of a carbon based resistive memory element as, for example shown in FIG. 1. In FIG. 2A current-voltage curves with a linear scale are illustrated while FIG. 2B shows a logarithmic representation of the same curve. The curves I1, I2 are obtained by the application of a triangular voltage pulse over approximately 2 microseconds (μs), wherein the voltage runs along the arrows attached to the curves I1 and I2. FIG. 2 shows that the I-V measurement according to curve I1 first shows a non-linear increase in the current as a function of the applied voltage. At a certain voltage TS, the resistivity drops significantly and reaches a minimum at about 175 microamps (μA). When lowering the applied voltage V, again the resistivity of the memory element remains changed in respect to the first part of the curve I1.

The solid line I2 refers to a second measurement which follows the return path of the first I-V curve I1. One can derive from the I-V characteristics shown in FIG. 2 that by applying a voltage pulse exceeding or reaching a switching threshold voltage TS, the resistivity of the storage layer 2 can be permanently altered. In principle, one can program multiple levels of resistance or resistivity by varying the pulse amplitude for the programmable voltage. The resistance margin or resistance window RM is indicative for the number of logic states that can be stored with a resistive memory cell. It may be desirable to have an extensive resistance margin RM and a wide read voltage window RW as indicated in FIG. 2.

It is therefore desirable to adapt the resistance margin RM, the threshold switching voltage TS and the read voltage window according to the needs of an application for the resistive memory element. Embodiments of the invention provide for mechanism for adapting the current voltage-characteristics of the used materials in the resistive memory element.

Investigations of the applicant have shown that in particular by doping the resistance changeable material in the storage layer 2, the I-V characteristic of the respective resistive memory element can be tailored to the needs of the application.

Figure 3:
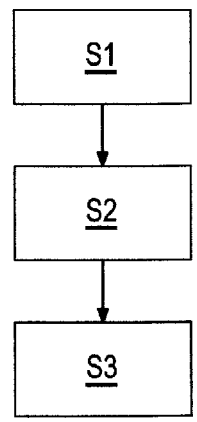
FIG. 3 shows a flow diagram with exemplary method steps for manufacturing a resistive memory element.

FIG. 3 shows a flow diagram of an embodiment of the method for manufacturing a resistive memory element.

In a first step S1, a storage layer comprising a resistance changeable material, as for example, amorphous carbon having a high $sp^3$-hybridized carbon fraction is provided.

In a second step S2, a doping process is performed. By the doping, an atomic order of the resistance changeable material can be rearranged, thereby changing the I-V characteristic of the memory element. In particular, the programming voltage or programming power (relating to the switching threshold TS) and the resistance window RM of resistive memory element may be altered. For example, using amorphous carbon as resistance changeable material, doping with hydrogen or nitrogen may enhance the creation of $sp^2$-hybridized carbon clusters. For example, investigations of the applicant suggest that the increase of the average cluster size of $sp^2$-carbon leads to a reduced programmable voltage.

Next, in step S3, contact layers for contacting the storage layer are provided. The storage layer is preferably disposed between a bottom conductive layer and a top conductive layer as for example shown in FIG. 1. As an example, TiN or Mo can be used as conductive layers for forming contacts.

Figure 4:
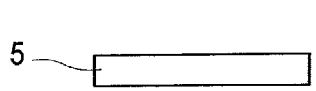
FIG. 4 illustrates method steps involved in the formation of a resistive memory element.
Figure 4:
Figure 4:
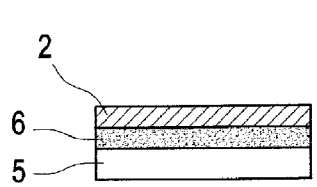
Figure 4:
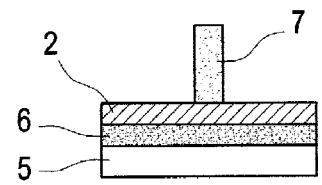

FIG. 4 illustrates method steps and aspects involved in one embodiment of a method for producing a resistive memory element or memory cell. In FIG. 4A a silicon substrate 5 is provided for further processing.

As shown in FIG. 4B, next a conducting layer 6 is deposited onto the silicon substrate 5, for example by sputtering. The conducting layer eventually acting as an electrode may comprise titanium nitride, molybdenum or vanadium.

Next, the storage layer 2 comprising carbon is sputtered onto the conducting layer 6. Contemporaneously, the carbon is doped with, for example, nitrogen. This is shown in FIG. 4C. For example, carbon can be dc-sputtered in an argon/nitrogen atmosphere onto the conducting layer 6. For example, the thickness of the conductive layer 6 may be approximately 40 nanometers (nm), and the carbon layer or storage layer 2 may have a thickness of 12 nm. However, one can also contemplate of other thicknesses such as 20 nm, 25 nm, 45 nm or 50 nm for the storage layer. As a result, an amorphous nitrogen-doped carbon layer suitable as resistive memory is produced. By choosing the dopant and doping percentage the resulting current-voltage characteristic may be engineered according to the needs of the device or application.

As shown in FIG. 4D, a top electrode 7 is provided. In order to perform measurements on the I-V characteristics of the storage layer 2, the top electrode may be a conducting tip of an atomic force microscope (AFM) setup. Additional circuitry which not shown explicitly in FIG. 4 may comprise a digital-to-analog converter, a logarithmic amplifier and a digital signal processor (DSP) for measuring the I-V characteristic laterally through the storage layer. The general form of an I-V characteristic of a resistive memory element is shown in FIG. 2 above.

For some applications it may be desirable to reduce the programming voltage, i.e., the switching threshold voltage of a given resistive memory cell structure. According to the presented method for manufacturing a resistive memory element, this can be achieved by appropriately doping the storage material.

Figure 5:
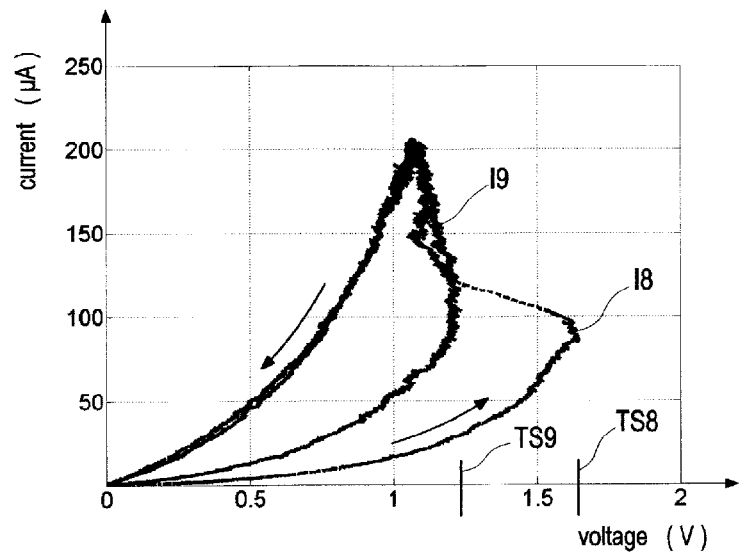
FIGS. 5 and 6 show current-voltage characteristics of some embodiments of resistive memory element produced according to the presented method comprising a doping process.
Figure 5:
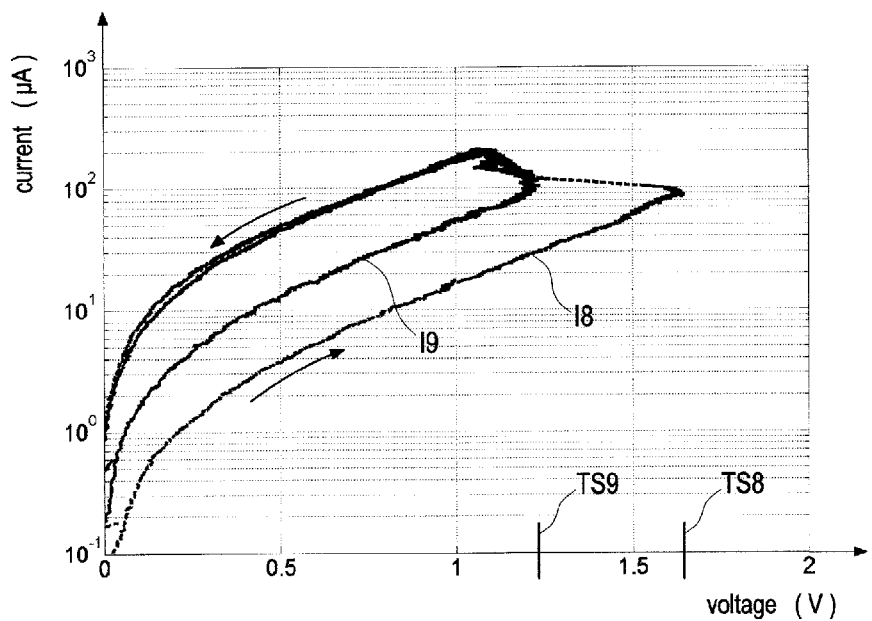

FIG. 5 shows the effect of doping an amorphous carbon layer, as storage layer, with nitrogen. The corresponding resistive memory element has the structure as shown in FIG. 4D with a 40 nm titanium nitride bottom conductive layer and a 12 nm amorphous carbon layer as storage layer. In FIG. 5A, current-voltage curves with a linear scale are illustrated while FIG. 5B shows a logarithmic representation of the same curves. Curve I8 in FIG. 5 corresponds to the un-doped memory element, and curve I9 corresponds to the storage layer doped with nitrogen. One can see from FIG. 5 that due to the nitrogen doping the programming voltage, i.e., the switching threshold voltage is reduced. Hence, by doping the storage layer or the resistance changeable material, respectively, a resistive memory element can be manufactured that is tailored to the needs of the respective application for the memory element.

Figure 6:
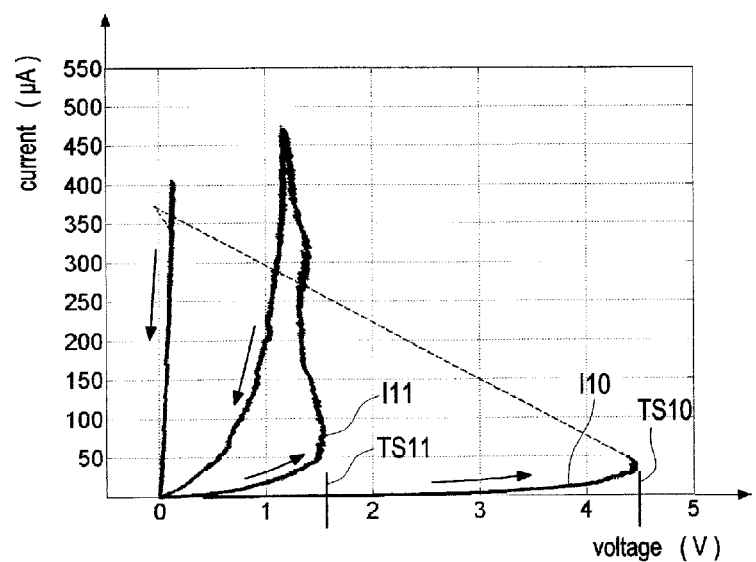
Figure 6:
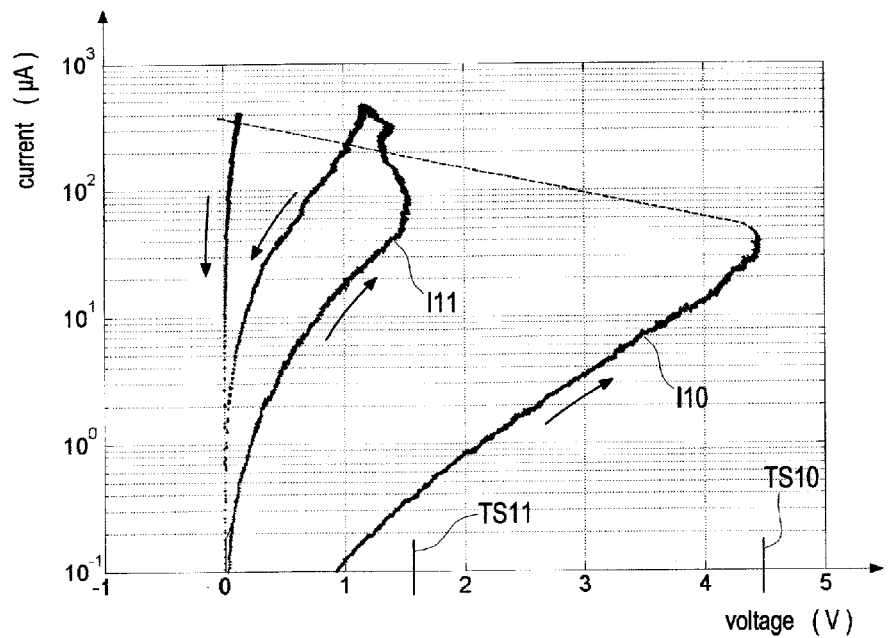

FIG. 6 shows the I-V characteristics of a memory element having the structure as shown in FIG. 4D, wherein the amorphous carbon or storage layer has a thickness of 25 nm. To achieve hydrogen doping of the amorphous carbon, the carbon layer is sputtered in a mixture of 98% argon and 2% hydrogen. In FIG. 6A, current-voltage curves with a linear scale are illustrated while FIG. 6B shows a logarithmic representation of the same curves. Curve I10 corresponds to a hydrogen-doped memory element, and curve I11 corresponds to an un-doped memory element. One can see from the curves in FIGS. 6A and 6B that by hydrogen doping, the programming voltage is significantly increased from TS11 about 1.6 V to TS10 about 4.5 V. One can further see that the resistance window is enlarged by the hydrogen doping.

In the illustrated embodiments with respect to the I-V curves in FIGS. 5 and 6 the different dopants have opposing effects on the switching threshold. Nitrogen decreases the switching threshold, and hydrogen increases the switching threshold. Therefore, one may tailor the properties of a respective memory element to the specific needs of its application by doping appropriately.

In addition to including a doping process in the formation of a resistive memory element structure, one can also tailor the programmable characteristics and resistance windows of carbon based memories by annealing the storage layer or the resistance changeable material, respectively. The annealing temperatures are preferably adapted so as to avoid a conversion of $sp^3$- to $sp^2$-carbon. Rather the annealing exclusively induces the increase of the average size of $sp^2$-clusters in the amorphous carbon layer.

Figure 7:
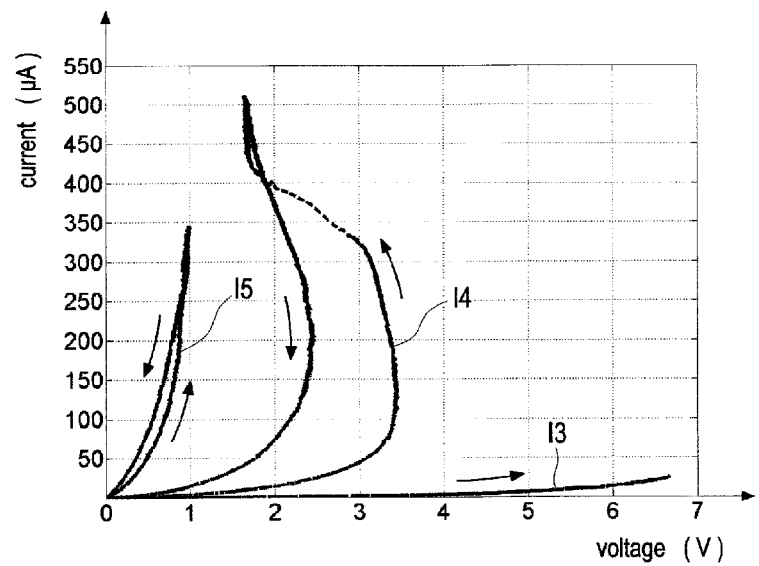
FIGS. 7 and 8 show current-voltage characteristics of resistive memory elements produced according to the presented method comprising an annealing process.
Figure 7:
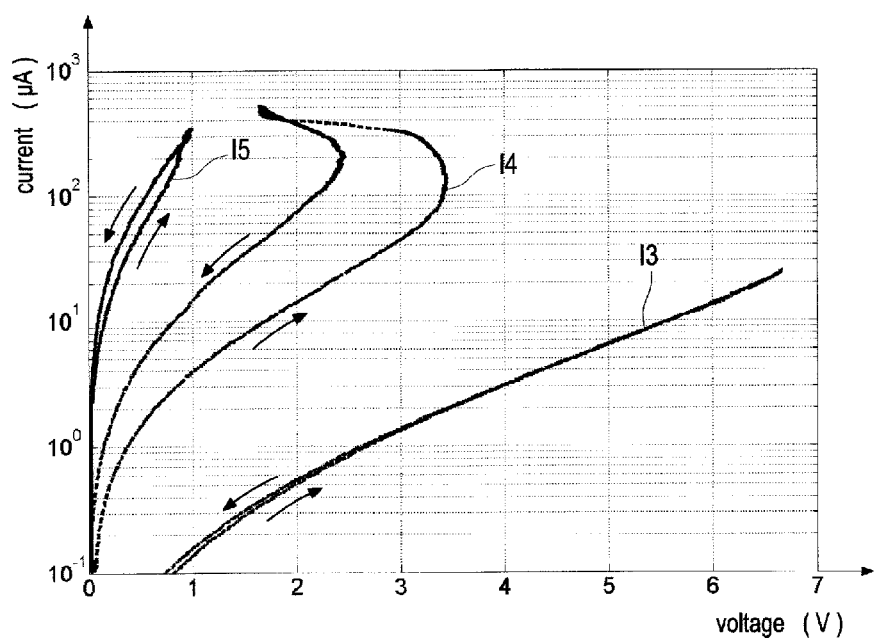

For example, FIG. 7 shows results for an I-V measurement on a resistive element having the structure of FIG. 4D. The thickness of the amorphous carbon layer, i.e., the storage layer is approximately 50 nm. In FIG. 7A, current-voltage curves with a linear scale are illustrated while FIG. 7B shows a logarithmic representation of the same curve. The I-V curve I3 corresponds to the resistive memory element annealed for five minutes in an argon environment at 400° C. The I-V curve I4 corresponds to the resistive memory element annealed for five minutes in argon at 500° C. The curve I5 corresponds to the resistive memory element annealed for five minutes in argon at 600° C. The annealing time is usually considerably longer than a thermally induced programming of the memory elements. In particular, voltage or laser pulses used to program the devices are on a shorter time scale of the order of nanoseconds.

FIG. 7 shows that by annealing the programming voltage or the switching threshold can be reduced. One can observe that the higher the annealing temperature the lower the switching voltage. Therefore, through annealing a pre-produced resistive memory element having an excessively high programming voltage (as for example curve I3 in FIG. 7) the device can be adapted to have a reasonable threshold switching voltage.

Figure 8:
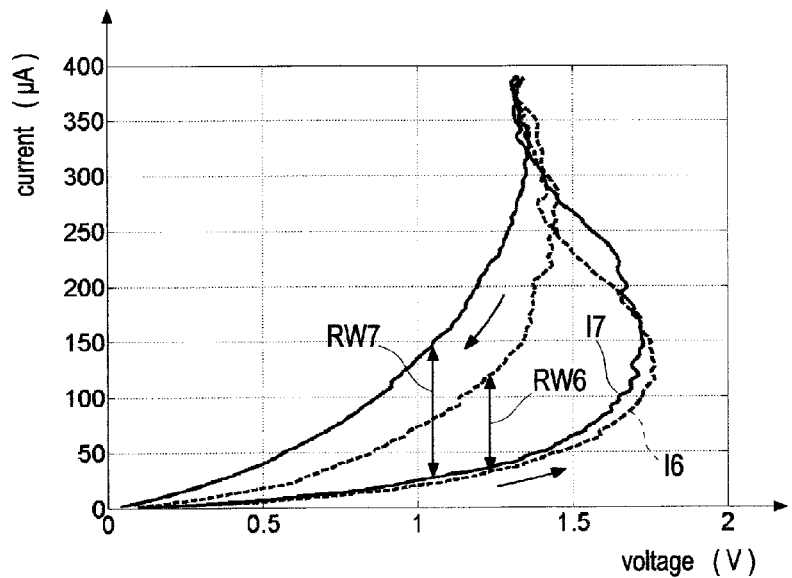
Figure 8:
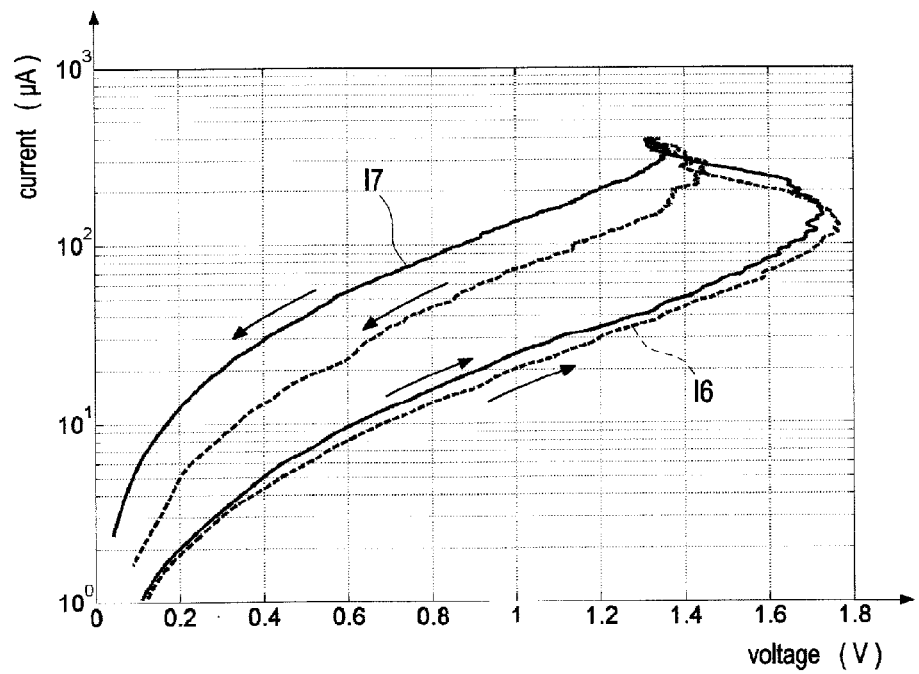

FIG. 8 shows another example for an annealing process altering the I-V characteristics of a given resistive memory element. FIG. 8 shows the I-V characteristic of a resistive memory element having the structure as shown in FIG. 4D with a storage layer thickness of 25 nm. In FIG. 8A, current-voltage curves with a linear scale are illustrated while FIG. 8B shows a logarithmic representation of the same curves. The dotted curve I6 shows the I-V curve of the device without annealing. A representative resistance window RW6 is also shown in FIG. 8A for curve I6. By imposing an annealing process for five minutes in argon at 200° C. (solid curve I7) the I-V curve for the device is altered. In particular, the resistance window RW7 is significantly increased with respect to the device without annealing (see I6). The larger resistance window facilitates the programming or setting of multiple resistance levels in the respective memory element.

Figure 9:
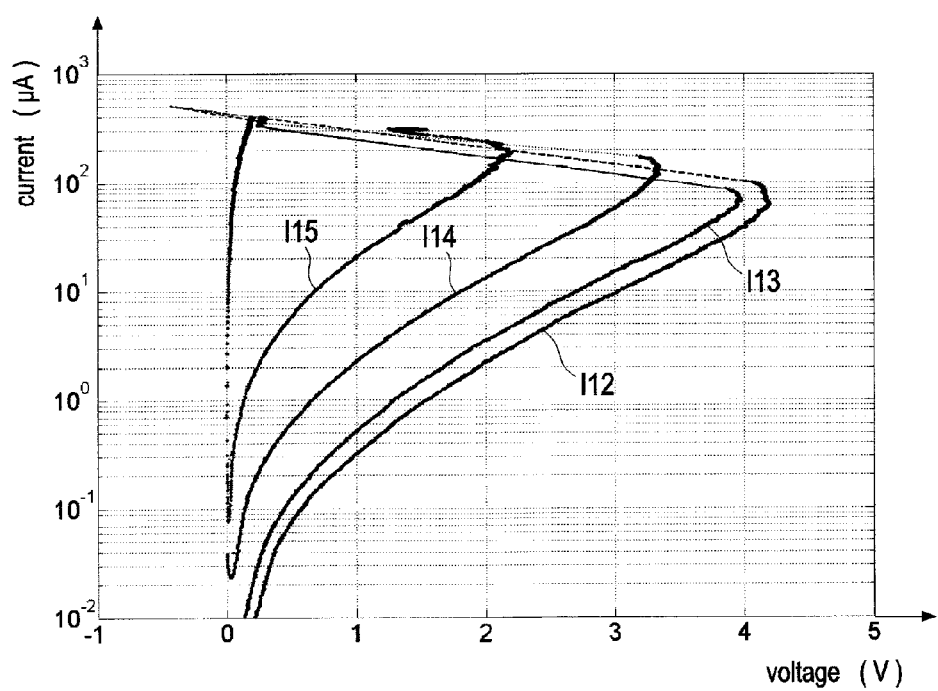
FIG. 9 shows current-voltage characteristics of resistive memory elements produced according to the presented method comprising an annealing process and a doping process.

One may also contemplate of combining an annealing process with doping the resistance changeable material, as for example, amorphous carbon. FIG. 9 shows the combined effects of annealing a resistive memory element and doping the resistance changeable material used in the memory element. The curves in FIG. 9 correspond to a resistive memory element structure which is comparable to the one discussed with respect to FIG. 8. The amorphous carbon was doped with hydrogen and eventually annealed at 200° C. (curve I13), at 300° C. (curve I14), and at 400° C. (line 15). Curve I12 corresponds to the un-annealed memory element with hydrogen doping.

The proposed methods for manufacturing tailor-made resistive memory elements allow for a variety of applications. In particular, multi-level programming is better achievable when the resistivity window is enhanced. It is also an advantage of the annealing process that the annealing process can be applied to a ready-made resistive memory cell structure in order to fine tune its characteristics for the desired application. For example, annealing may compensate or enhance effects to the I-V characteristic obtained through doping during the formation process. Annealing may also compensate for impurities in the resistance changeable storage material.

Figure 10:
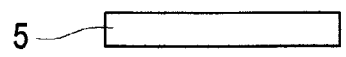
FIG. 10 illustrates method steps involved in an alternative method for producing a resistive memory element.
Figure 10:
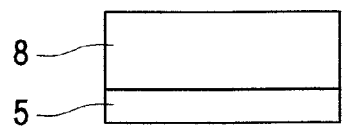
Figure 10:
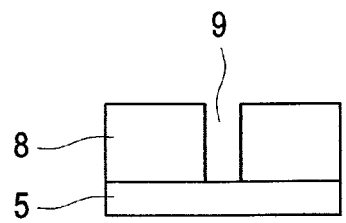
Figure 10:
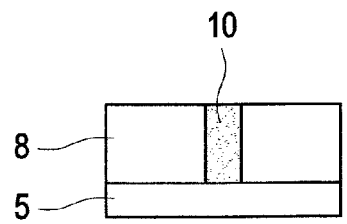
Figure 10:
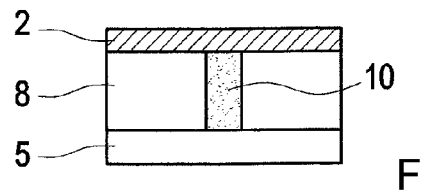
Figure 10:
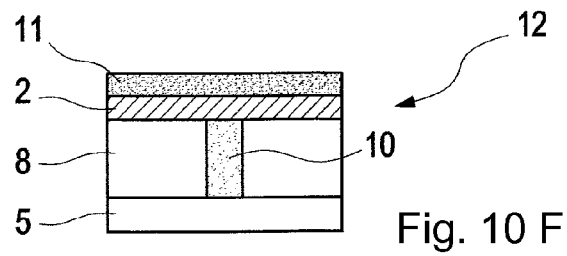

One can also contemplate of geometrically different structures as those shown in FIG. 4 for the memory element. FIG. 10 illustrates a method for producing an additional embodiment of a resistive memory element. FIG. 10A shows a substrate 5 provided for further processing. The substrate, for example, may comprise silicon.

Next, as shown in FIG. 10B, a silicon oxide layer 8 is provided on the substrate 5. A trench 9 is provided in the silicon oxide layer 8, for example, by an etching process. This is shown in FIG. 10C.

The trench 9 is then filled with titanium/titanium nitride, for example, by sputter deposition and subsequent chemical-mechanical polishing. The titanium nitride 10 is surrounded by the isolating silicon oxide 8 and acts as bottom electrode.

Next, an amorphous carbon layer is sputtered onto the structure as shown in FIG. 10E. Thereby a storage layer 2 is formed. Contemporaneously, the carbon can be doped, for example with nitrogen or hydrogen. This may be achieved by sputtering the carbon under a hydrogen or nitrogen comprising atmosphere. The doping can also be performed as a separate process according to conventional techniques.

Next, a conducting layer 11 as top electrode is provided. The top electrode can be made of titanium nitride. The memory element as shown in FIG. 10F resembles the structure of a phase change memory mushroom cell. However, different geometries and structures can also be contemplated for a resistive memory element according to this disclosure.

Often many memory elements and potentially other electronic circuitry are disposed on a bulk substrate material or a wafer structure. According to embodiments of the invention, the proposed tailoring of the current voltage characteristics in addition to the doping by annealing can be used to treat the entire wafer or substrate with the memory. In other words, a bulk treatment or bulk annealing may be performed for fine-tuning to desired I-V properties. According to an embodiment of the invention, the annealing step is performed by arranging resistive memory elements, a wafer comprising resistive memory elements or integrated circuits comprising resistive memory elements in an oven at a predetermined temperature over a predetermined annealing time.

Figure 11:
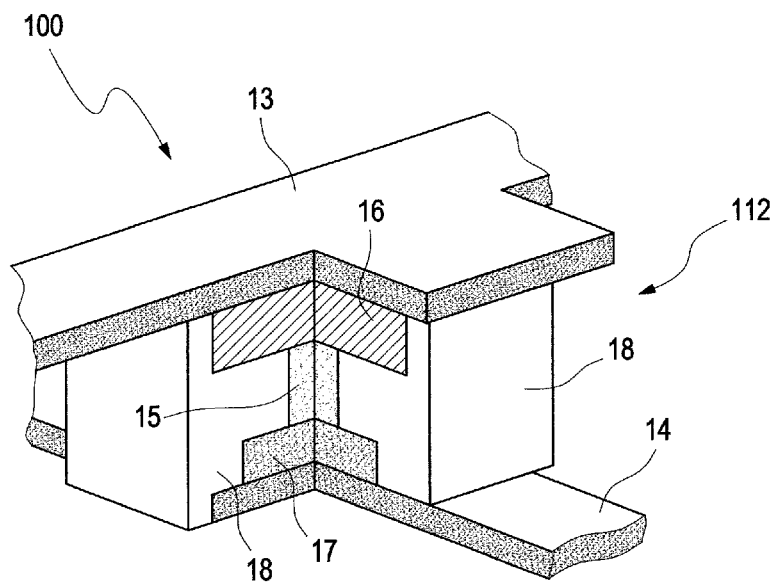
FIG. 11 is a partial perspective view of an embodiment of a memory device including a resistive memory element.
Figure 12:
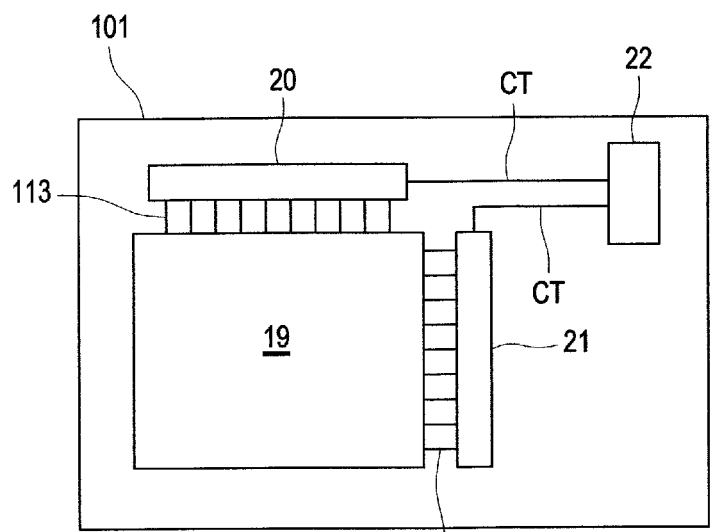
FIG. 12 shows a schematic block diagram of an integrated circuit comprising an array of resistive memory elements.

FIG. 11 shows a section of a memory device including a resistive memory cell or memory element. The perspective view in FIG. 12 shows a word line 14 and a bit line 13 which are essentially perpendicular to each other. At the crossing between the word line 13 and the bit line 14, the resistive memory cell 112 according to this disclosure is placed. The resistive memory cell 112 comprises a contact region 16 which acts as a top electrode, a region 15 comprising resistance changeable material, such as amorphous carbon, and a surrounding isolating material 18, as for example silicon oxide. Further, an access device 17 is assigned to the resistive memory cell 112. The access device can be, for example, a selection transistor or a selection diode. The selection device 17 acts as a bottom electrode in the arrangement shown in FIG. 11.

FIG. 12 shows a block diagram of an integrated circuit with the plurality of resistive memory cells. The integrated circuit 101 has an array 19 comprising memory cell arrangements as shown in FIG. 11, i.e., a plurality of word and bit lines, wherein at the crossings resistive memory elements or memory cells are disposed. The word lines 114 are coupled to a word line decoder 21, and the bit lines 113 are coupled to a bit line decoder 20. The word line decoder and the bit line decoder 21, 20 can be controlled by a control device 22 by appropriate control signals CT.

As mentioned above, the optional heat treatment, i.e., the annealing, for further tailoring the programming characteristics of the carbon-based memory can be imposed on entire integrated circuits and more particularly on wafers or substrates carrying prefabricated memory devices.

The presented methods and devices provide for changing and adapting the read and write characteristics of, in particular, carbon based resistive memory devices according to desired properties. In particular, embodiments of the invention allow to adapt the programming power, the programming voltage and the read voltage window of a resistive memory device. Therefore, as an example, multi-level programming capability of known devices employing carbon based memory is facilitated.

LIST OF REFERENCE CHARACTERS 1 resistive memory element
2 storage layer
3 bottom electrode
4 top electrode
5 substrate
6 conducting layer
7 electrode
8 isolating layer
9 trench
10 bottom electrode
11 top electrode
12 resistive memory element
13 bit line
14 word line
15 resistance changeable material
16 top electrode
17 access device
18 isolating material
19 memory cell array
20 bit line decoder
21 word line decoder
22 controller
100 resistive memory device
101 integrated circuit
112 resistive memory cell
113 bit lines
114 word lines
CT control signal
I current
I1-I15 current curves
RM resistance margin
RW6, RW7 resistance margin
S1, S2, S3 method step
TS switching threshold
TS8, TS9 switching threshold
V voltage

The invention claimed is:

1. A method for manufacturing a resistive memory element comprising:
   providing a storage layer comprising a resistance changeable material, said resistance changeable material comprising amorphous carbon;
   providing contact layers for contacting the storage layer, wherein the storage layer is disposed between a bottom contact layer and a top contact layer; and
   doping the resistance changeable material with hydrogen, by sputtering the storage layer in a mixture containing less than 10% hydrogen.

2. The method of claim 1, wherein a resistance change of the storage layer is induced electro-thermally by Joule heating for programming the resistive memory element.

3. The method of claim 1, wherein the mixture contains about 2% hydrogen.

4. The method of claim 1, further comprising: annealing the resistance changeable material at a predetermined temperature over a predetermined annealing time for rearranging an atomic order of the resistance changeable material.

* * * * *